United States Patent [19]

Franken et al.

[11] Patent Number: 5,150,153
[45] Date of Patent: Sep. 22, 1992

[54] LITHOGRAPHIC DEVICE WITH A SUSPENDED OBJECT TABLE

[75] Inventors: Dominicus J. Franken, Veldhoven; Fransiscus M. Jacobs, Asten; Johannes M. M. Van Kimmenade, Ell; Cornelis D. Van Dijk, Boxtel; Jan Van Eljk, Eindhoven, all of Netherlands

[73] Assignee: U.S. Philips Corp., New York, N.Y.

[21] Appl. No.: 804,577

[22] Filed: Dec. 10, 1991

[30] Foreign Application Priority Data

Feb. 5, 1991 [NL] Netherlands ............... 9100202

[51] Int. Cl.$^5$ ............................... G03B 27/42
[52] U.S. Cl. ................................ 355/53; 355/63
[58] Field of Search ...................... 355/53, 63, 67

[56] References Cited

U.S. PATENT DOCUMENTS

| | | | |
|---|---|---|---|
| 4,431,304 | 2/1984 | Mayer | 355/534 |
| 4,676,630 | 6/1987 | Matsushita et al. | 355/53 |
| 4,676,649 | 6/1987 | Phillips | 356/401 |
| 4,708,465 | 11/1987 | Isohata et al. | 355/53 |
| 4,737,823 | 4/1988 | Bouwer et al. | 355/53 |
| 4,770,531 | 9/1988 | Tanaka et al. | 355/53 X |
| 4,937,618 | 6/1990 | Ayata et al. | 355/53 X |
| 5,061,956 | 10/1991 | Takubo et al. | 355/53 X |

Primary Examiner—Richard A. Wintercorn
Attorney, Agent, or Firm—Steven R. Biren

[57] ABSTRACT

A lithographic device with a lithographic irradiation system (1, 13) which is fastened near a lower side to a mounting member (5) of a frame (7). The device is provided with a unit (65) which is formed by a positioning device (37), with which an object table (21) arranged below the irradiation system (1, 13) is displaceable, and by a support member (35), over which the object table (21) is guided by means of an aerostatic foot (31). In an operational position, the unit (65) is coupled to a carrier (67) by means of coupling members (73), the carrier (67) being suspended from the mounting member (5) by means of suspension elements (79, 81, 83), so that the unit (65) is arranged between lower frame supports (25) of the frame (7) and a compact construction is obtained.

The unit (65) can be rotated from the operational position to an end position, in which the unit (65) is entirely outside the frame (7) and is easily accessible for maintenance, by means of a rotation mechanism (87) and a swivel mechanism (89).

The lithographic device can be used inter alia for irradiating semiconductor substrates, a semiconductor pattern provided on a mask (11) being imaged on a semiconductor substrate (19) provided on the object table (21) by means of the irradiation system (1, 13).

9 Claims, 13 Drawing Sheets

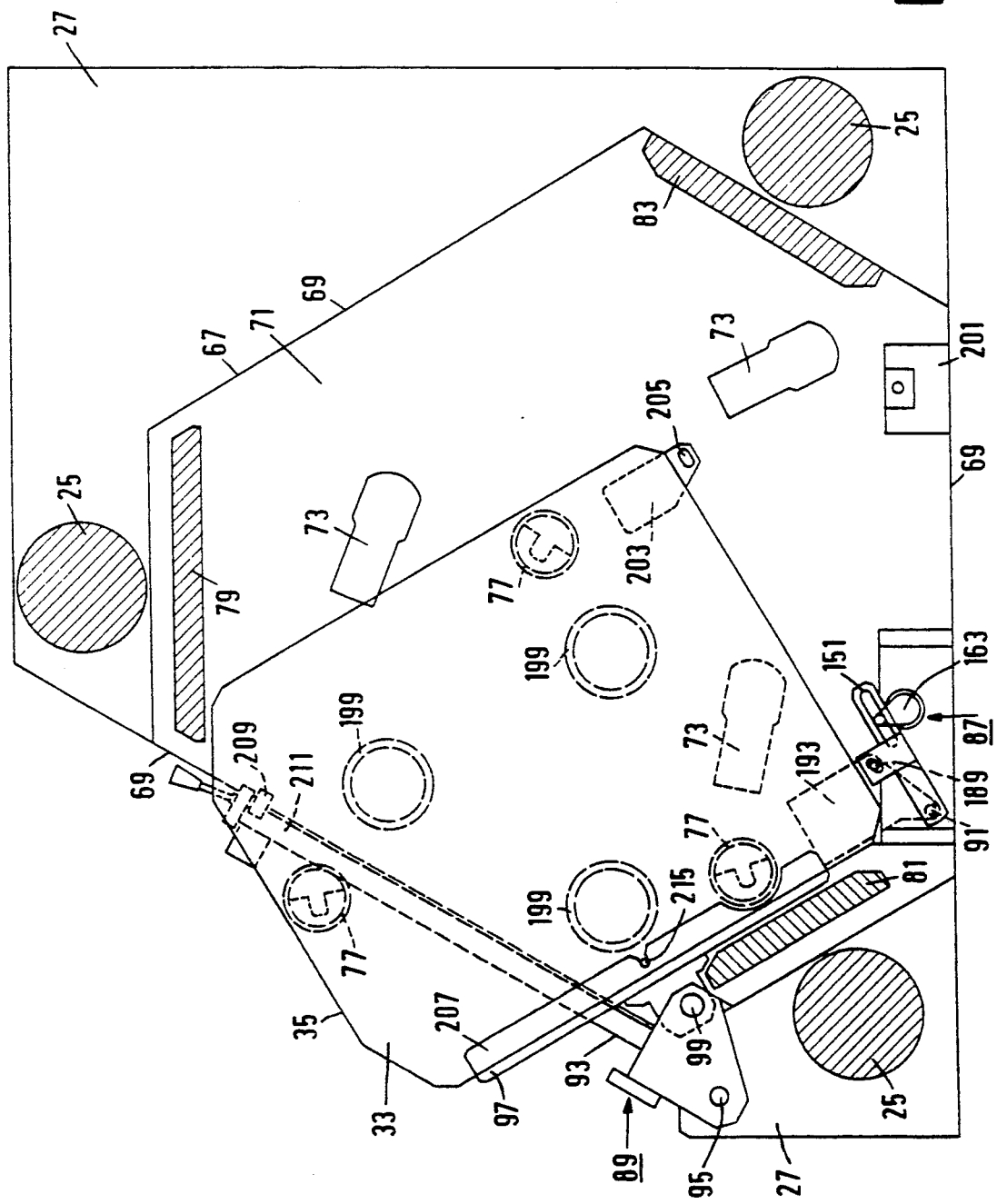

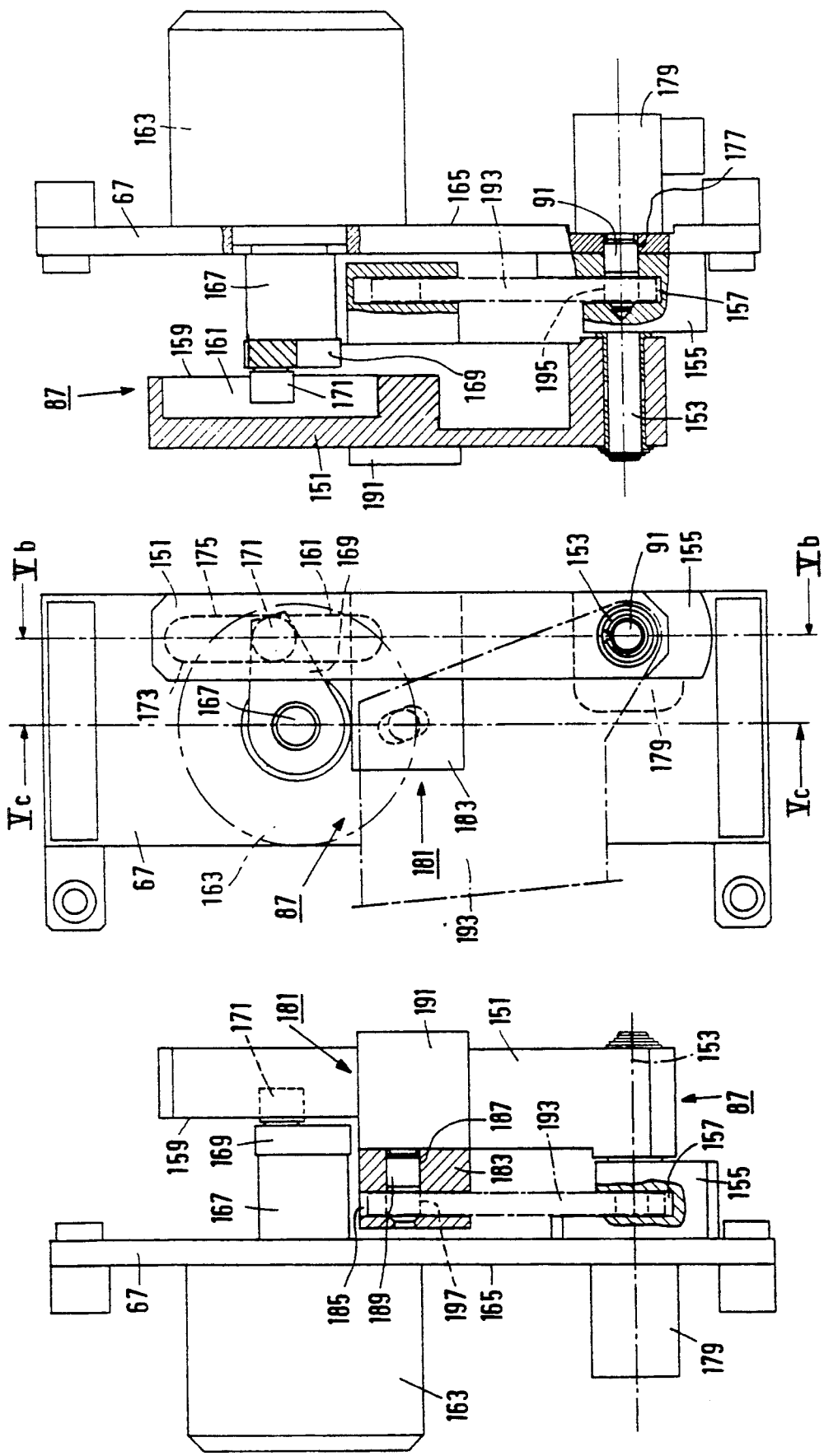

5,150,153

LITHOGRAPHIC DEVICE WITH A SUSPENDED OBJECT TABLE

BACKGROUND OF THE INVENTION

The invention relates to a lithographic device comprising a lithographic irradiation system which has a vertical main axis parallel to a z-direction and is fastened near a lower side to a mounting member belonging to a frame of the device, and comprising a positioning device which is arranged below the irradiation system and by means of which an object table is displaceable relative to the irradiation system over a guide surface of a support member coupled to the positioning device, which guide surface extends perpendicular to the z-direction.

A lithographic device of the kind described in the opening paragraph is used for carrying out a lithographic process on a substrate positioned on the object table, such as, for example, an optical lithographic process in which the irradiation system is provided with a lens system and a light source (for example, a UV-light source), an X-ray lithographic process in which the irradiation system is provided with an X-ray source, or an electrolithographic process in which the irradiation system is provided with an electron tube. U.S. Pat. No. 4,737,823 discloses an optical lithographic device of the kind mentioned in the opening paragraph in which the irradiation system is provided with a lens system which is fastened to the mounting member near a lower side. In this known lithographic device, the support member is a rectangular granite slab which forms part of the frame of the device. Four columns of the frame extending parallel to the z-direction are fastened on the guide surface formed by an upper side of the support member, to which columns the mounting member, which is constructed as a plate extending in a direction transverse to the main axis, with the lens system is fastened at some distance above the support member. At a lower side, the support member is provided with lower frame supports, each provided with a spring member and a damping member.

A frame construction as described above results in a comparatively great constructional height of the device in the z-direction. The constructional height of the known lithographic device is determined inter alia by the height of the lens system, the height of the positioning device and the support member, and the height of the lower frame supports. Such a constructional height is disadvantageous, especially in an application of the device in a conditioned production room for, for example, integrated circuits.

SUMMARY OF THE INVENTION

It is an object of the invention to provide a lithographic device of which the constructional height is comparatively small.

The invention is for that purpose characterized in that the positioning device and the support member are positioned as a unit on a carrier which is suspended from the mounting member. The use of a carrier suspended from the mounting member renders a construction of the frame possible in which the mounting member is fastened on the lower frame supports and in which the positioning device and the support member are arranged between the lower frame supports, so that a compact construction is obtained seen in the z-direction.

It is noted that Japanese Patent Application 61-41426 discloses an optical lithographic device with a suspended object table. The object table in that case, however, is displaceable together with the suspension construction relative to the lens system.

A special embodiment of the lithographic device according to the invention is characterized in that the support member is coupled to the carrier by means of a first elastic coupling member and a first damping member, while the positioning device is fastened to the support member by means of a second elastic coupling member and a second damping member. The use of the said coupling members and damping members and an optimization of the mass of the support member in relation to the mass of the positioning device and the mass of the frame provides an optimized mechanical screening of the positioning device from external vibrations such as, for example, mechanical resonance vibrations of the frame of the device.

A further embodiment of the lithographic device according to the invention, which provides a particularly rigid and light suspension of the carrier from the mounting member seen in the direction of the main axis, is characterized in that the carrier of the support member and of the positioning device is suspended from the mounting member by means of plate-shaped suspension elements, each of the said suspension elements extending in a vertical plane which is parallel to the main axis.

A still further embodiment of the lithographic device according to the invention, which provides a particularly rigid, light and compact suspension of the carrier from the mounting member seen in a direction transverse to the main axis and a compact construction of the frame, is characterized in that the carrier is suspended from the mounting member by means of three plate-shaped suspension elements, the mounting member being fastened on a base of the frame by means of three lower frame supports, while the suspension elements are arranged in a triangle and the said vertical planes enclose mutual angles of substantially 60°, each of the lower frame supports being positioned near an external side of one of the suspension elements seen in a radial direction relative to the main axis.

A special embodiment of the lithographic device according to the invention is characterized in that the unit formed by the support member and the positioning device is displaceable in a direction transverse to the main axis relative to the carrier and the mounting member. The positioning device with the object table is readily accessible to an operator of the lithographic device for, for example, maintainance or repairs, in that the said unit is displaced relative to the carrier and the mounting member.

A further embodiment of the lithographic device according to the invention, in which the said unit is displaceable by means of a simple construction, is characterized in that the unit formed by the support member and the positioning device is rotatable relative to the carrier and the mounting member about an axis of rotation which is directed substantially parallel to the main axis.

A yet further embodiment of the lithographic device according to the invention is characterized in that the unit is rotatable by a first rotation movement from an operational position, in which the support member is coupled to the carrier, to a first intermediate position, is rotatable by a second rotation movement from the first intermediate position to a second intermediate position, and is rotatable by a third rotation movement from the second intermediate position to an end position in which the unit is entirely outside the frame. Since the unit is rotatable relative to the frame by the three said rotation movements, the unit can be brought outside the frame in a practical and effective way, particularly when the frame is provided with lower frame supports and suspension elements positioned in a triangle. The positioning device is thereby accessible for minor cleaning operations in the second intermediate position of the unit, while the unit is readily accessible for repairs in the said end position.

A special embodiment of the lithographic device according to the invention, in which the unit is rotatable relative to the carrier substantially without friction, is characterized in that during the first rotation movement of the unit the support member is coupled to a rotation shaft connected to the frame and is guided over an upper surface of the carrier by means of a static fluid bearing.

A further embodiment of the lithographic device according to the invention is characterized in that in the first intermediate position of the unit the support member is couplable to a second rotation arm which is rotatably supported on a first rotation arm rotatably mounted to the frame, the second rotation arm being locked relative to the first rotation arm and the first rotation arm being locked relative to the frame during the first rotation movement of the unit, in that the second rotation movement of the unit is formed by a rotation movement of the second rotation arm relative to the first rotation arm, during which the support member is coupled to the second rotation arm and the first rotation arm is locked relative to the frame, in that the second rotation arm can be locked relative to the first rotation arm in the second intermediate position of the unit, and in that the third rotation movement of the unit is formed by a rotation movement of the first rotation arm relative to the frame, during which the support member is coupled to the second rotation arm and the second rotation arm is locked relative to the first rotation arm. The use of the two rotation arms means that the unit can be rotated to outside the frame by hand in a quick and simple way.

BRIEF DESCRIPTION OF THE DRAWINGS

The invention is explained in more detail below with reference to the drawing, in which:

FIG. 5a is a plan view of a pneumatic rotation mechanism by which the unit of FIG. 2 is rotatable from the operational position shown in FIG. 3a to the first intermediate position shown in FIG. 3b, FIG. 5b shows a cross-section of the rotation mechanism taken on the line Vb—Vb in FIG. 5a, FIG. 5c shows a cross-section of the rotation mechanism taken on the line Vc—Vc in FIG. 5a, FIG. 6 is a side elevation of a swivel mechanism of the optical lithographic device of FIG. 1.

DESCRIPTION OF THE PREFERRED EMBODIMENTS

Figure 1:
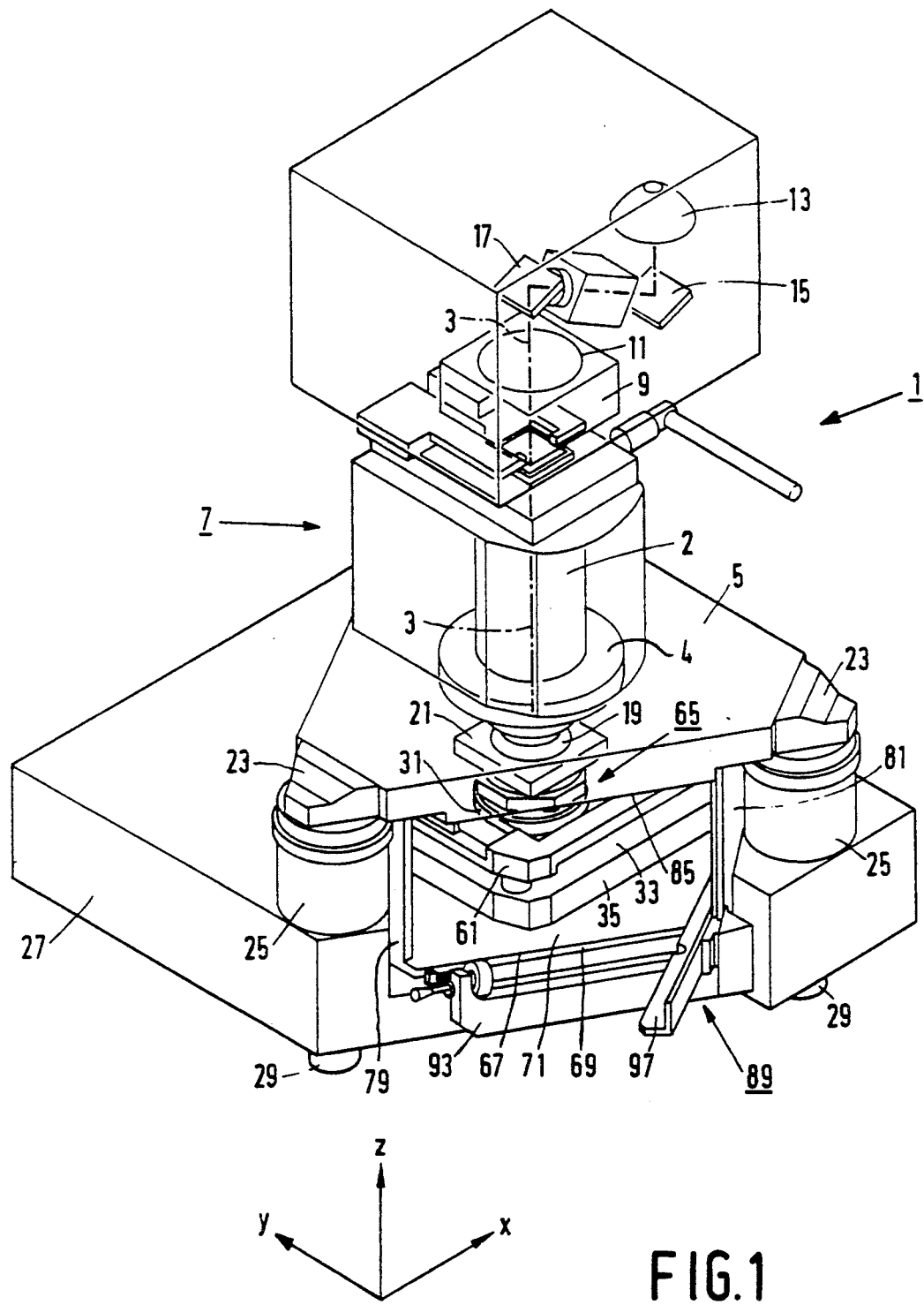
FIG. 1 is a perspective view of an optical lithographic device according to the invention.

The optical lithographic device illustrated in FIGS. 1 to 9 is provided with an optical irradiation system 1, shown merely diagrammatically in FIG. 1, which comprises a lens system 2 arranged in a vertical z-direction. The lens system 2 has an optical main axis 3 extending in a direction parallel to the z-direction and is provided with a mounting ring 4 near a lower side. By means of the mounting ring 4, the lens system 2 is mounted to a mounting member 5 which forms part of a frame 7 of the device and which is constructed as a triangular plate extending in a plane perpendicular to the optical main axis 3. Near an upper side of the lens system 2, the optical lithographic device is provided with a mask manipulator 9 for positioning and supporting a mask 11 relative to the lens system 2. During operation, a light beam coming from a light source 13 of the irradiation system 1 is guided via mirrors 15 and 17 of the irradiation system 1 through the mask 11 which contains, for example, a pattern of an integrated semiconductor circuit, and focused by the lens system 2 on a substrate such as, for example, a semiconductor substrate 19 provided on an object table 21. In this way the said pattern is imaged on a reduced scale on the semiconductor substrate 19. The object table 21 is displaceable parallel to an x-direction which is perpendicular to the optical main axis 3, and parallel to a y-direction which is perpendicular to the optical main axis 3 and to the x-direction. The semiconductor substrate 19 can be illuminated in a large number of locations corresponding to identical integrated circuits by means of a stepwise displacement of the object table 21 parallel to the x-direction and the y-direction to different illumination positions. It is noted that the centre of gravity of the lens system 2 is situated near a central plane of the mounting ring 4 extending transverse to the z-direction, so that a stable support of the lens system 2 relative to the frame 7 is provided by the mounting ring 4.

The mounting member 5 is provided with three corner portions 23 which each rest on a lower frame support 25. Only two corner portions 23 and two lower frame supports 25 are visible in FIG. 1. The lower frame supports 25 are positioned on a base portion 27 of the frame 7 which is placed on a flat foundation by means of adjustment members 29. By means of the lower frame supports 25, which are each provided with a spring member and a damping member of a kind known per se and not shown in any detail in FIG. 1, the optical lithographic device is low-frequency (3 Hz) spring-supported on the foundation in a direction parallel to the z-direction and in a direction transverse to the z-direction. In this way it is prevented that vibrations of the foundation, which adversely affect an accurate operation of the optical lithographic device, are transmitted through the lower frame supports 25 to the mounting member 5 and to the lens system 2.

Figure 2:
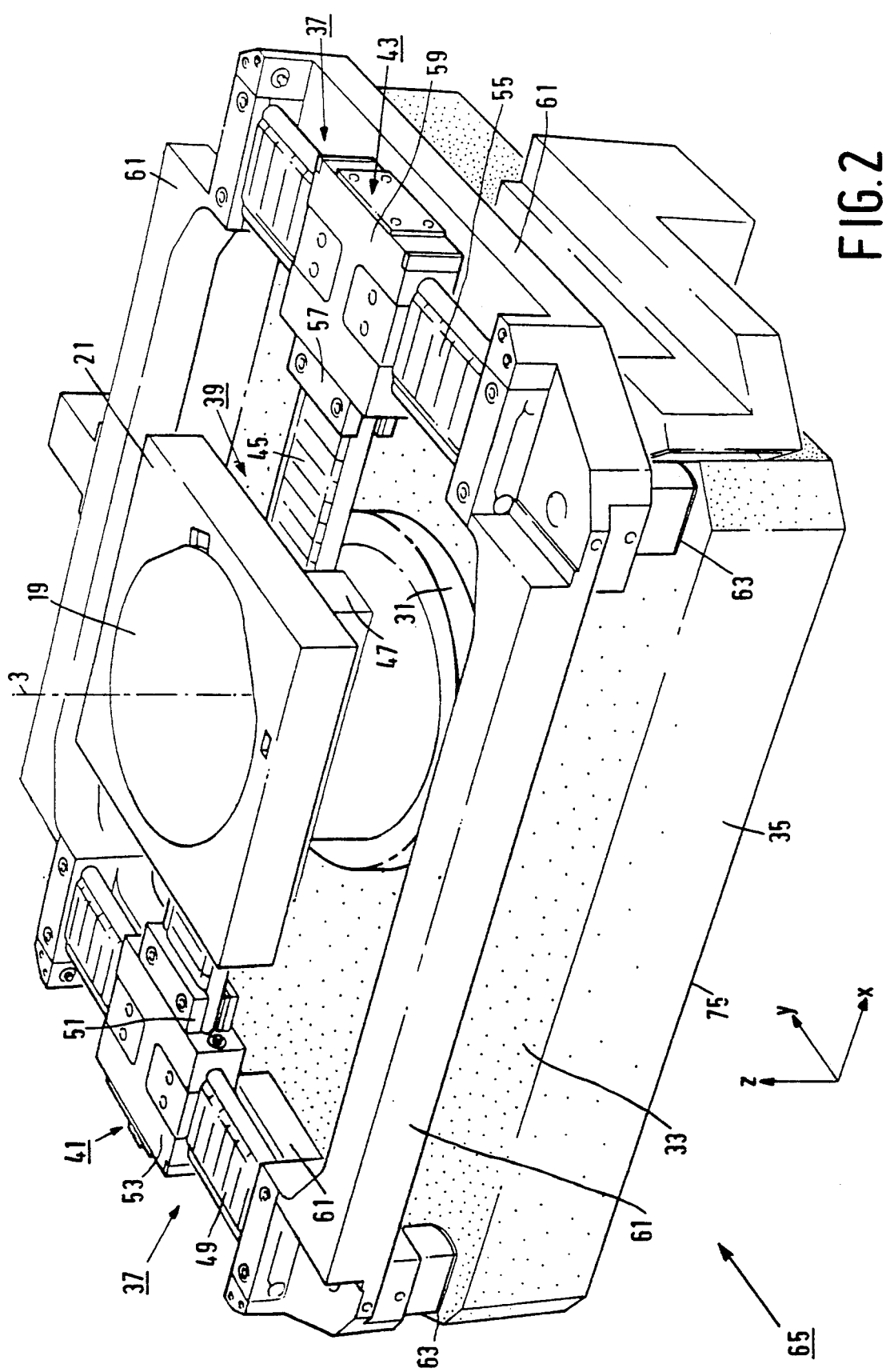
FIG. 2 shows a unit constituted by a positioning device and a support member of the optical lithographic device of FIG. 1, FIG. 3a diagrammatically shows a cross-section of the optical lithographic device of FIG. 1 in which the unit of FIG. 2 is in an operational position, FIG. 3b diagrammatically shows a cross-section of the optical lithographic device of FIG. 1 in which the unit of FIG. 2 is in a first intermediate position, FIG. 3c diagrammatically shows a cross-section of the optical lithographic device of FIG. 1 in which the unit of FIG. 2 is in a second intermediate position, FIG. 3d diagrammatically shows a cross-section of the optical lithographic device of FIG. 1 in which the unit of FIG. 2 is in an end position.

As is shown in detail in FIG. 2, the object table 21 is guided over an upper surface 33 of a support member 35 in the form of a granite slab extending perpendicular to the optical main axis 3 by means of a so-called aerostatic foot 31, which is provided with a static gas bearing. The object table 21 is displaceable over the upper surface 33 by means of a positioning device 37 which comprises three linear electric motors 39, 41 and 43. As is shown in FIG. 2, the linear motor 39 comprises an x-stator 45 extending parallel to the x-direction and an x-translator 47 fastened to the object table 21 by which the object table 21 is displaceable along the x-stator 45 parallel to the x-direction. The linear motors 41 and 43 respectively comprise a y-stator 49 extending parallel to the y-direction with a y-translator 53 fastened to a first end 51 of the x-stator 45, and a y-stator 55 extending parallel to the y-direction with a y-translator 59 fastened to a second end 57 of the x-stator 45. The y-stators 49 and 55 are fastened to a window frame 61 of the positioning device 37, which frame is fastened near its corners on the upper surface 33 of the support member 35. As FIG. 2 shows, rubber plates 63 are provided there between the frame 61 and the upper surface 33 of the support member 35. The use of the rubber plates 63 prevents high-frequency vibrations, such as, for example, natural vibrations of the frame 7, from being transmitted to the object table 21 via the support member 35 and the frame 61. The object table 21 is displaceable by means of the linear motors 41 and 43 parallel to the y-direction and rotatable through a very limited angle about an axis of rotation which is parallel to the optical main axis 3. It is noted that the aerostatic foot 31 and the positioning device 37 with the linear motors 39, 41 and 43 positioned in an H-arrangement relative to one another are known per se from U.S. Pat. No. 4,737,823.

Figure 3A:
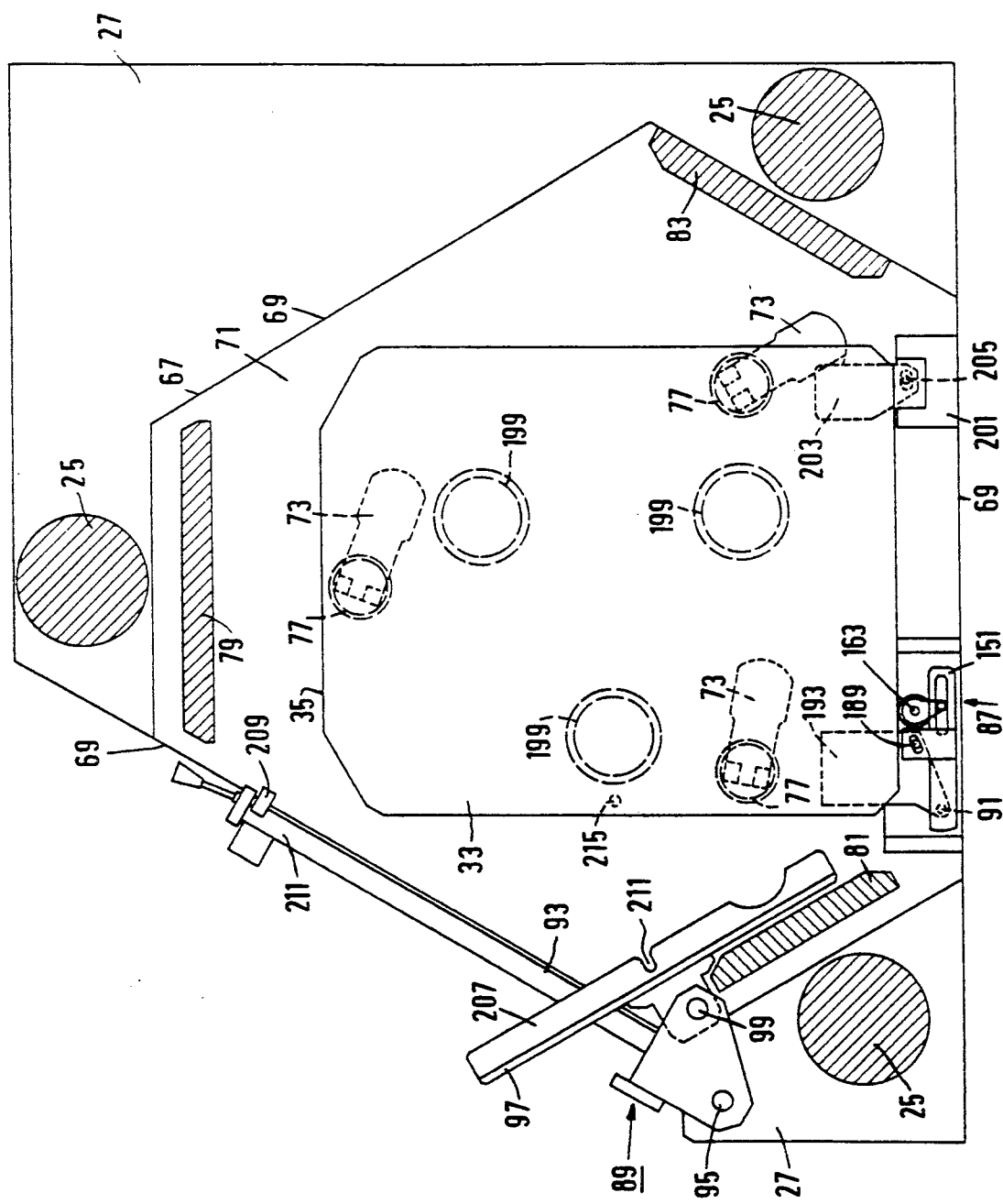

As is shown in FIGS. 1 and 2, the support member 35 and the positioning device 37 constitute a unit 65 which is provided on a carrier 67 of the frame 7. FIGS. 3a to 3d show that the carrier 67 is formed by a substantially triangular plate extending perpendicular to the optical main axis 3 and having major sides 69 which each extend between two lower frame supports 25. An upper side 71 of the carrier 67 is provided with three pneumatic coupling members 73 depicted only diagrammatically in FIGS. 3a to 3d, which in an operational position of the unit 65 shown in FIG. 3a are in engagement with three coupling bases 77 of the support member 35 provided at a lower side 75 of the support member 35. The coupling members 73 of the carrier 67 and the coupling bases 77 of the support member 35 are described in more detail below. The carrier 67 is suspended from a lower side 85 of the mounting member 5 indicated in FIG. 1 by means of three plate-shaped suspension elements 79, 81 and 83. In FIG. 1, only the suspension elements 79 and 81 are partly visible, while in FIGS. 3a to 3d the suspension elements 79, 81 and 83 are shown in cross-section. The suspension elements 79, 81 and 83 are each formed by a plate which extends in a vertical plane parallel to the optical main axis 3, the relevant vertical planes enclosing angles of substantially 60° with one another. The use of the suspension elements 79, 81 and 83 provides a suspended construction of the carrier 67 with the mounting member 5, the unit 65 formed by the support member 35 and the positioning device 37 being arranged between the lower frame supports 25. In this way a compact construction of the optical lithographic device is obtained seen both in the z-direction and transverse to the z-direction. Furthermore, the said suspended construction has a high rigidity in the direction of the optical main axis 3 and in a direction perpendicular to the optical main axis 3 through the use of the suspension elements 79, 81 and 83. Moreover, the use of the suspended construction achieves that the centre of gravity of the displaceable parts of the positioning device 37 is situated near a central plane of the lower frame supports 25 which extends transverse to the z-direction. The spring members and damping members of the lower frame supports 25 referred to earlier are present in the said central plane. This limits undesirable movements of the frame 7 on the lower frame supports 25 caused by reactional forces exerted by the moving parts of the positioning device 37 on the frame 7 via the support member 35.

It is achieved through the compact construction of the optical lithographic device in the z-direction that an admissible constructional height of the device is not exceded. The admissible constructional height is determined by an available height in an operational room for the device, such as, for example, a conditioned production room for integrated circuits. The compact construction of the device also has the result, however, that the positioning device 37 with the object table 21 in the operational position shown in FIG. 3a is less easily accessible to an operator of the device for, for example, maintainance or repairs. To render the positioning device 37 better accessible for maintainance, the device is provided with a pneumatic rotation mechanism 87 which is fastened to the carrier 67 and which is shown merely diagrammatically in FIGS. 3a–3d, and with a swivel mechanism 89 which is fastened to the base portion 27 of the frame 7. By means of the pneumatic rotation mechanism 87, the unit 65 is rotatable relative to the carrier 67 about a rotation pin 91 of the carrier 67 which is directed parallel to the optical main axis 3 from the operational position shown in FIG. 3a to a first intermediate position shown in FIG. 3b. The positioning device 37 is accessible for, for example, minor cleaning work in the first intermediate position. The swivel mechanism 89 is provided with a first rotation arm 93, which is rotatable relative to the frame 7 about a first hinge pin 95 of the base portion 27 directed parallel to the optical main axis 3, and with a second rotation arm 97 which is rotatable relative to the first rotation arm 93 about a second hinge pin 99 of the first rotation arm 93 directed parallel to the optical main axis 3. By means of the swivel mechanism 89, the unit 65 is rotatable from the first intermediate position depicted in FIG. 3b to a second intermediate position depicted in FIG. 3c by a rotation of the second rotation arm 97 relative to the first rotation arm 93. The unit 65 is rotatable from the second intermediate position to an end position depicted in FIG. 3d by a rotation of the first rotation arm 93 relative to the frame 7. In the end position shown in FIG. 3d the unit 65 is entirely outside the frame 7, and the positioning device is easily accessible for maintainance or repairs. The pneumatic rotation mechanism 87 and the swivel mechanism 89 are described in detail below.

Figure 3D:
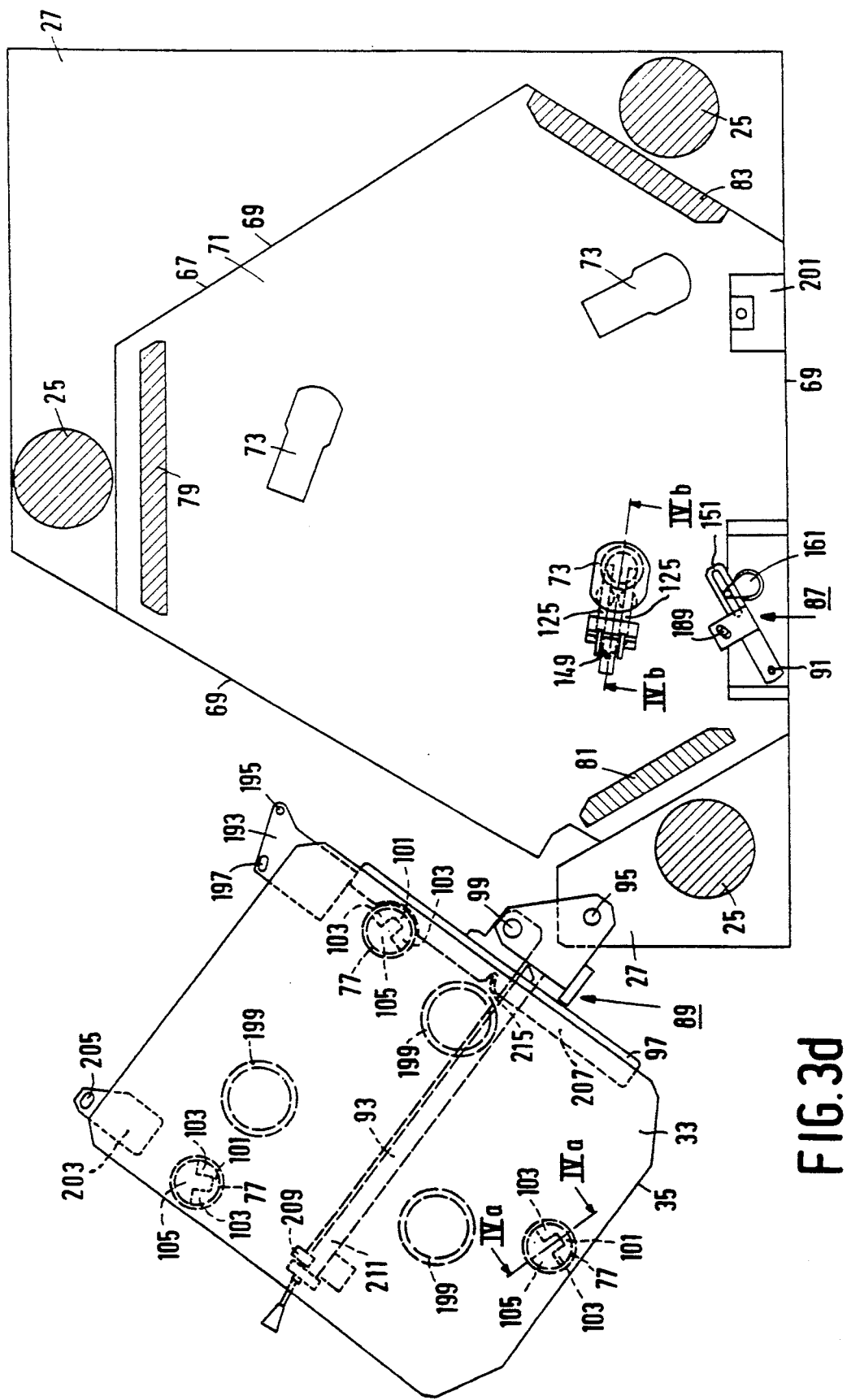
Figure 4A:
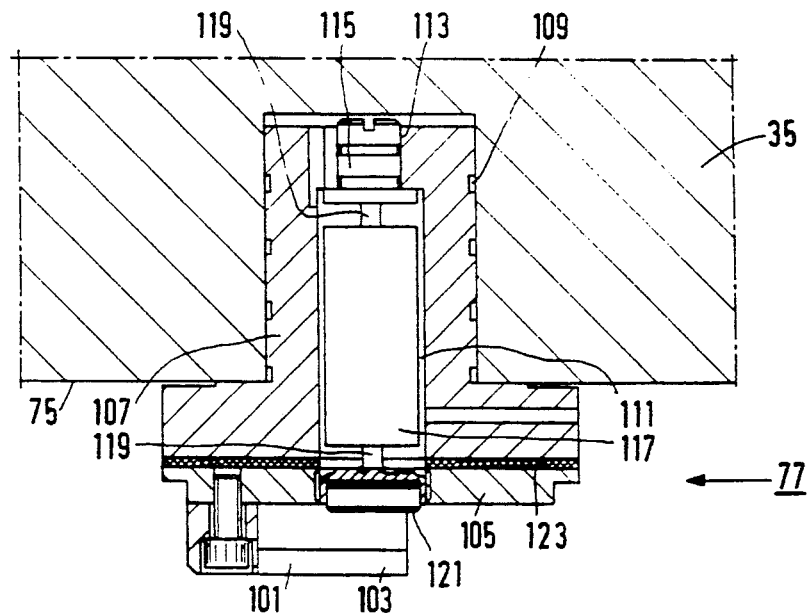
FIG. 4a shows a cross-section of a coupling base of the support member taken on the line IVa—IVa in FIG. 3d.

As was described above, the support member 35 is coupled to the carrier 67 by means of the pneumatic coupling members 73 and the coupling bases 77 in the operational position depicted in FIG. 3a. As FIGS. 3d and 4a show, each coupling base 77 is provided with a C-shaped clamping plate 101 having legs 103 which is screwed to a disc-shaped portion 105 of the relevant coupling base 77. The coupling base 77 is further provided with a circular cylindrical portion 107 which is glued in a hole 109 drilled in the lower side 75 of the support member 35. A first drilled hole 111 and a second drilled hole 113 which has a reduced diameter compared with the first drilled hole 111 are provided in the circular cylindrical portion 107 of the coupling base 77. A circular cylindrical end 115 of a support pin 117, which is present with clearance in the first drilled hole 111, is glued in the second drilled hole 113. The support pin 117 is further provided with two portions of reduced diameter which each form a so-called elastic hinge 119, and with a support face 121. Finally, the coupling base 77 is provided with a disc-shaped rubber plate 123 which is glued between the disc-shaped portion 105 and the circular cylindrical portion 107.

Figure 4B:
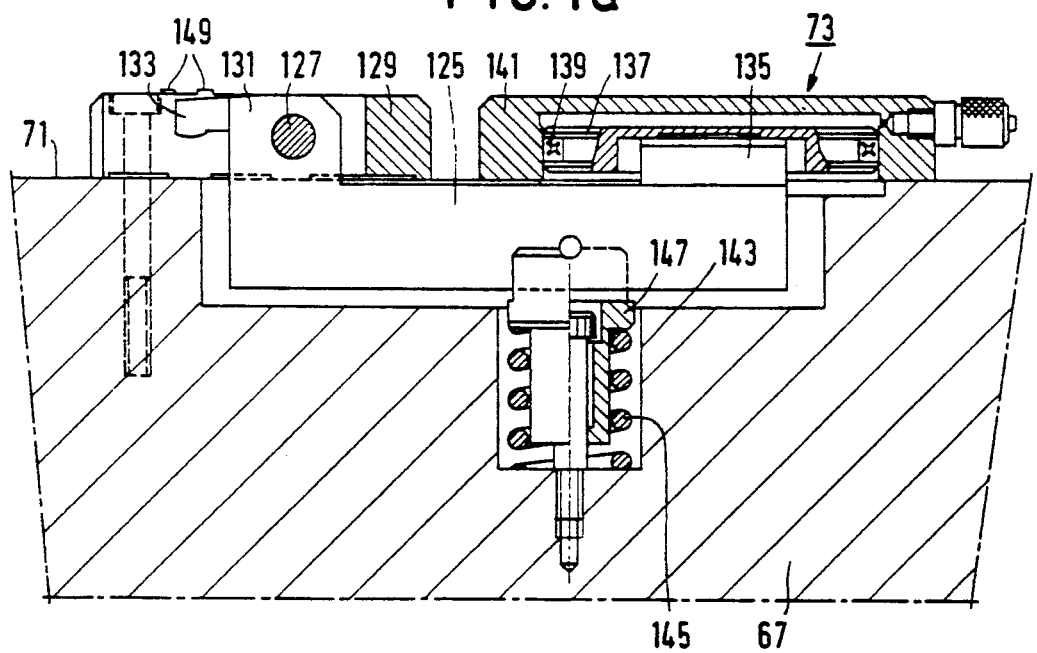
FIG. 4b shows a cross-section of a pneumatic coupling member of the carrier taken on the line IVb—IVb in FIG. 3d.

As is shown in FIGS. 3d and 4b, each pneumatic coupling member 73 is provided with two levers 125 which are fastened to a rotation pin 127, which pin 127 is journalled in a block 129 fastened to the carrier 67. Each lever 125 is provided with a clamping element 133 near a first end 131, and is fastened to a piston 137 with sealing ring 139, which is displaceable in a cylinder 141, near a second end 135. Furthermore, two holes 143 are drilled in the upper side 71 of the carrier 67. A pretensioned mechanical helical spring 145, which bears on a spring holder 147 of one of the levers 125, is provided in each drilled hole 143. The block 129 is further provided with three contact faces 149 (see FIG. 3d).

In the operational condition shown in FIG. 3a, the support face 121 of each coupling base 77 bears on the three contact faces 149 of one of the coupling members 73. The two legs 103 of the C-shaped clamping plate 101 are below the two clamping elements 133 of the coupling member 73 during this. The clamping elements 133 are pressed against the legs 103 of the clamping plate 101 under spring pressure of the mechanical helical springs 145, so that the support face 121 of the support pin 117 is securely pressed against the three contact faces 149 of the block 127.

The use of the support pins 117 provides a rigid coupling of the unit 65 to the carrier 67 seen in the z-direction. In a direction transverse to the z-direction, the support pins 117 are elastically deformable owing to the use of the elastic hinges 119, so that differences in thermal expansion between the support member 35 and the carrier 67 are accommodated by elastic deformation of the support pins 117. The use of the disc-shaped rubber plates 123 prevents high-frequency vibrations, such as, for example, natural vibrations of the frame 7, from being transmitted to the support member 35 via the coupling members 73 and the coupling bases 77. The positioning device 37 is mechanically optimally screened against the said natural vibrations of the frame 7 in that the rubber plates 123 in combination with the rubber plates 63 referred to above are used and in that the mass of the support member 35 is optimized in relation to the mass of the positioning device 37 and the mass of the frame 7.

As was noted above, the unit 65 is rotatable by means of the pneumatic rotation mechanism 87 from the operational position shown in FIG. 3a to the first intermediate position shown in FIG. 3b. The rotation mechanism 87 depicted in FIGS. 5a to 5c is provided with a switch bar 151 which is rotatable about a rotation axle 153 which is parallel to the optical main axis 3. The rotation axle 153 is connected to a block 155 which is fastened on the carrier 67 and which is provided with a recess 157 which extends transverse to the rotation axle 153. The switch bar 151 is provided with a longitudinal slot 161 near a lower side 159. The rotation mechanism 87 is further provided with a pneumatic drive motor 163 which is fastened to a lower side 165 of the carrier 67. An output shaft 167 of the drive motor 163 which is directed parallel to the rotation axle 153 is provided with a lateral arm 169 near an end. A roller member 171 is provided on the lateral arm 169 eccentrically relative to the output shaft 167, which roller member 171 is situated substantially without clearance between side walls 173 and 175 of the said slot 161. When the lateral arm 169 is rotated by the pneumatic drive motor 163, the switch bar 151 is rotated about the rotation axle 153.

As is shown in FIG. 5b, a hole 177 is drilled in the block 155 and in the carrier 67, which hole is situated coaxially relative to the said rotation axle 153. The rotation pin 91 mentioned above is provided in the drilled hole 177, where it can be shifted by means of a first pneumatic short-stroke cylinder 179. As FIGS. 5a and 5c show, a coupling mechanism 181 with a block 183 is fastened to the switch bar 151, the block 183 being provided with a recess 185 which extends transverse to the rotation axle 153 and with a drilled hole 187. A locking pin 189 can be shifted in the drilled hole 187 by means of a second pneumatic short-stroke cylinder 191. A coupling plate 193 shown in FIGS. 3a to 3d which is fastened to the lower side 75 of the support member 35 and which is provided with a first drilled hole 195 and a second drilled hole 197 is situated in the said recesses 157 and 185 in the operational position depicted in FIG. 3a. The first drilled hole 195, which has a diameter equal to the diameter of the drilled hole 177, is thereby coaxial with the drilled hole 177, and the second drilled hole 197, which has a diameter equal to the diameter of the drilled hole 187, is coaxial with the drilled hole 187 (see FIGS. 5b and 5c).

To turn the unit 65 from the operational position to the first intermediate position, the rotation pin 91 and the locking pin 189 are passed into the first drilled hole 195 and the second drilled hole 197 by means of the first short-stroke cylinder 179 and the second short-stroke cylinder 191, respectively, so that the unit 65 is coupled to the switch bar 151 through the coupling plate 193. Then the unit 65 is uncoupled from the carrier 67 through the supply of compressed air to the cylinders 141 of the coupling members 73. Simultaneously three static gas bearings 199 fastened to the lower side 75 of the support member 35 are put into operation, after which the unit 65 is rotated about the rotation pin 91 by means of the rotation mechanism 87. The unit 65 is guided over the upper side 71 of the carrier 67 substantially without friction thanks to the use of the static gas bearings 199 during this.

As is diagrammatically shown in FIGS. 3a to 3d, a coupling mechanism 201 is fastened to the upper side 71 of the carrier 67. The coupling mechanism 201 is of a similar kind to the coupling mechanism 181 of the switch bar 151 and is not shown in any further detail in FIGS. 3a to 3d. A further coupling plate 203 with a drilled hole 205 is also fastened to the lower side 75 of the support member 35. After the unit 65 has been returned from the first intermediate position to the operational position, the unit 65 is brought into an accurate position relative to the carrier 67 by means of the coupling mechanism 201 in that a locking pin (not shown in the Figures) of the coupling mechanism 201 is passed into the drilled hole 205 of the coupling plate 203. After that, the static gas bearings 199 are switched off and the unit 65 is coupled to the carrier 67 by means of the coupling members 73 through the discharge of the compressed air from the cylinders 141. Finally, the coupling plate 203 is disengaged from the coupling mechanism 201 and the rotation pin 91 and the locking pin 189 are removed from the first drilled hole 195 and the second drilled hole 197 of the coupling plate 193 by the first short-stroke cylinder 179 and the second short-stroke cylinder 191, respectively.

In the first intermediate position depicted in FIG. 3b, the support member 35 rests with the lower side 75 on a support plate 207 of the second rotation arm 97 of the swivel mechanism 89. The support plate 207 extends alongside the second rotation arm 97 and is situated in a plane transverse to the optical main axis 3. The support member 35 further rests on a support wheel 209 in the first intermediate position, which support wheel is rotatably fastened to an end 211 of the first rotation arm 93 of the swivel mechanism 89. To support the support member 35 in the first intermediate position, furthermore, the static gas bearings 199 are operational.

Figure 8:
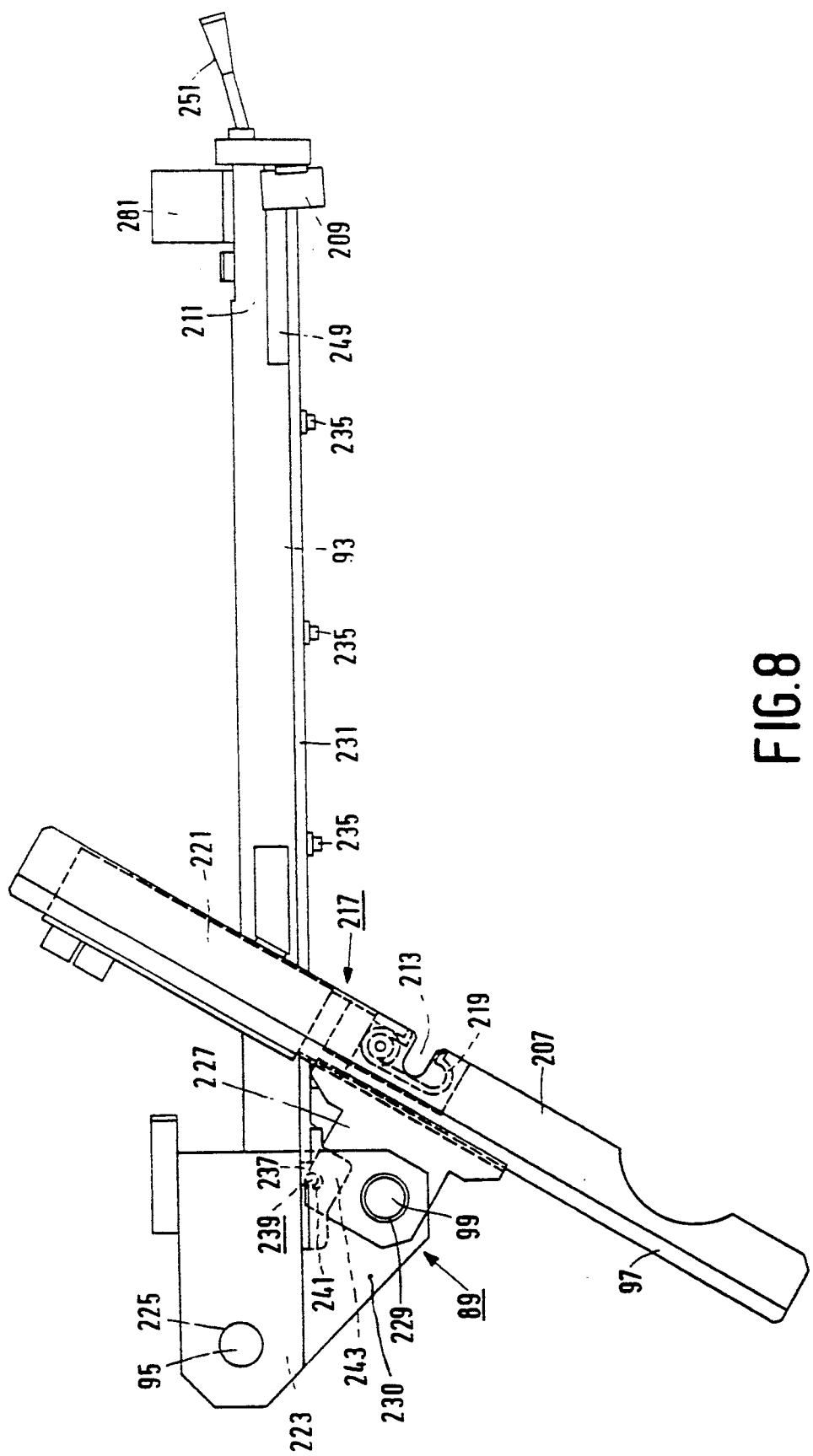
FIG. 8 is a plan view of the swivel mechanism of FIG. 6.

As is shown in FIG. 8, a recess 213 is provided in the support plate 207. In the first intermediate position, a locking pawl 215 fastened to the lower side 75 of the support member 35 and shown in FIGS. 3a to 3d is situated in the recess 213. The second rotation arm 97 is provided with a locking mechanism 217 with a hook 219 which is drawn around the locking pawl 215 by means of a pneumatic cylinder 221 in the first intermediate position. The unit 65 is thus coupled to the second rotation arm 97 of the swivel mechanism 89. The unit 65 is uncoupled from the rotation mechanism 87 after that in that the rotation pin 91 and the locking pin 189 are removed from the first and the second drilled hole 195, 197 of the coupling plate 193 by means of the first and the second short-stroke cylinder 179, 191, respectively.

Figure 6:
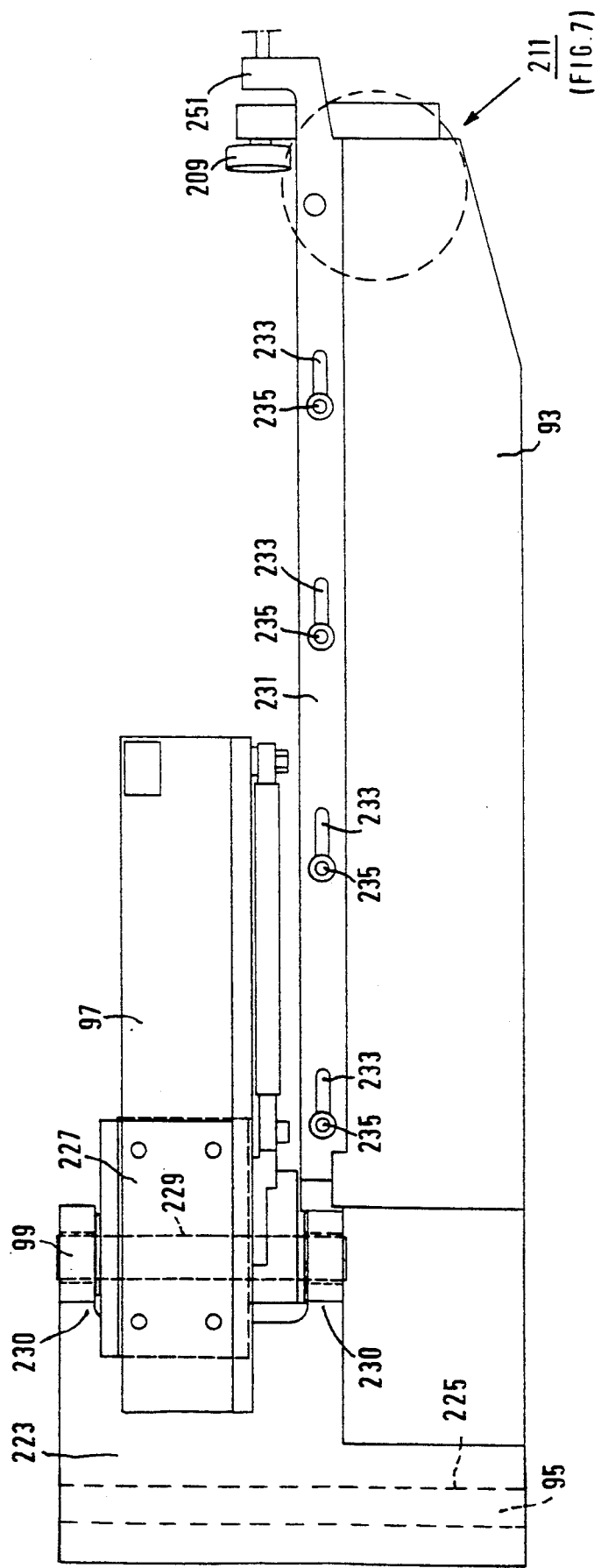
Figure 7:
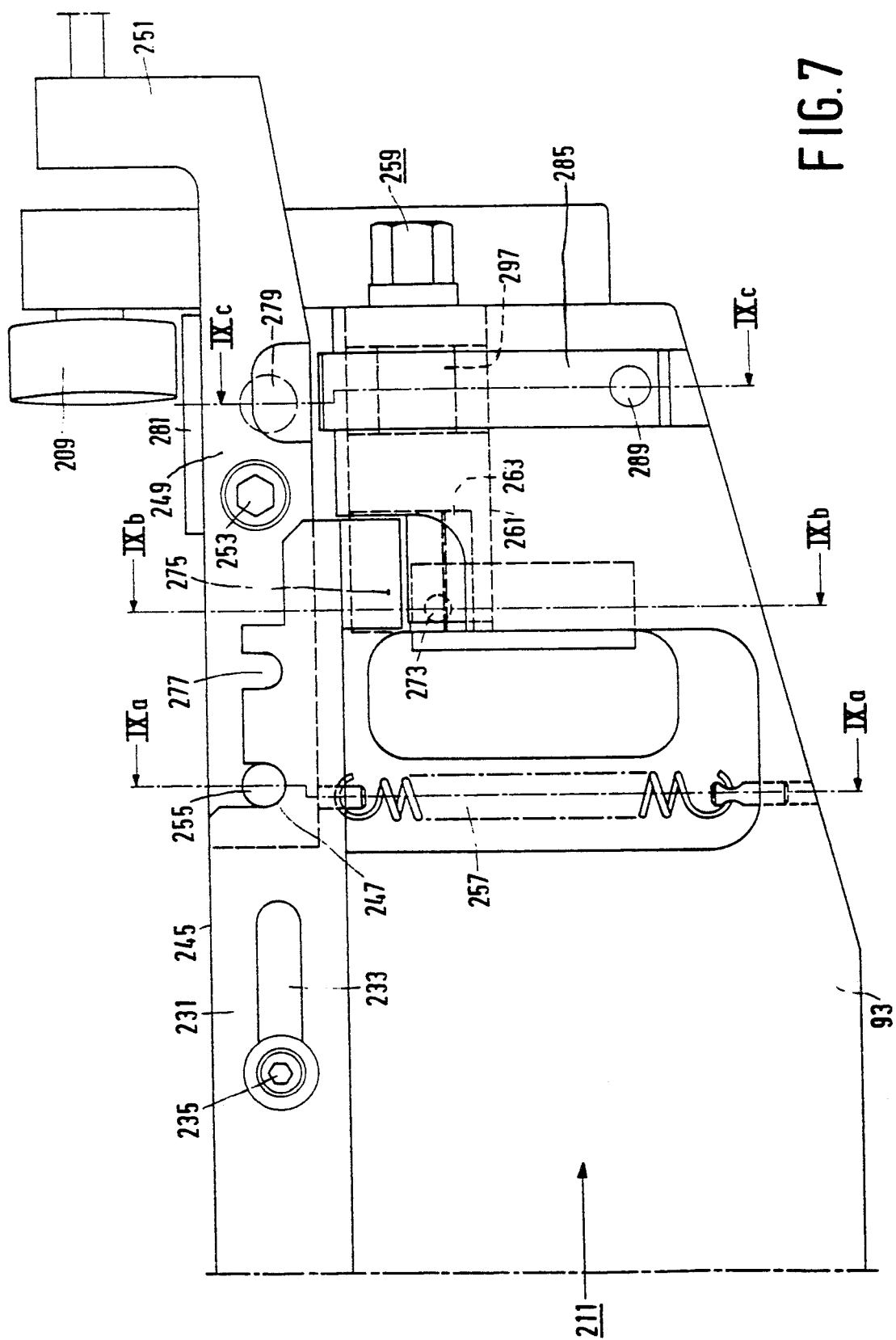
FIG. 7 is a side elevation of an end of a rotation arm of the swivel mechanism of FIG. 6.

As FIGS. 6, 7 and 8 show, the first rotation arm 93 is provided with a first hinge housing 223 having a drilled hole 225. The first rotation arm 93 can rotate about the first hinge pin 95 referred to above and fastened to the base portion 27 by means of the first hinge housing 223. The second rotation arm 97 is provided with a second hinge housing 227 having a drilled hole 229. The second rotation arm 97 can rotate about the second hinge pin 99 fastened to two horizontal plates 230 of the first hinge housing 223 by means of the second hinge housing 227. The first rotation arm 93 is further provided with a slide arm 231 with slots 233. The slide arm 231 can slide along bolts 235 which are screwed through the slots 233 into the first rotation arm 93. The slide arm 231 is provided with a coupling pin 239 near a first end 237. The coupling pin 239 is in engagement with a recess 241 of a coupling plate 243 which is fastened to the second hinge housing 227. The assembly of the coupling pin 239 and the coupling plate 243 ensures that the slide arm 231 is shifted along the bolts 235 when the second rotation arm 97 is rotated about the second hinge pin 99.

Figure 9A:
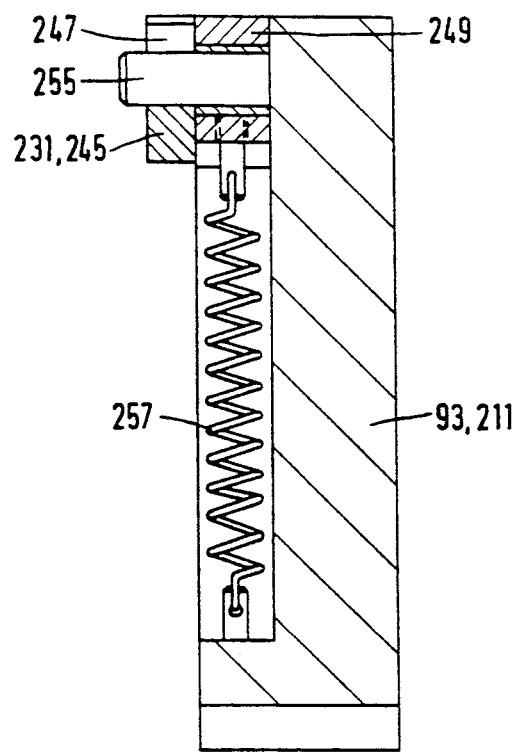
FIG. 9a shows a cross-section of the end of the rotation arm taken on the line IXa—IXa in FIG. 7.

As is shown in detail in FIGS. 7 and 9a, the slide arm 231 is provided with a first recess 247 near a second end 245. Furthermore, a tilting lever 249 with handle 251 is fastened to the end 211 of the first rotation arm 93. The tilting lever 249 is rotatable about a bolt 253 which is screwed into the end 211 of the first rotation arm 93 and which is provided with a locking pawl 255. In the first intermediate position of the unit 65, the slide arm 231 is in a position as shown in FIG. 7, whereby the locking pawl 255 of the tilting lever 249 is held in the first recess 247 of the slide arm 231 by means of a mechanical spring 257. In this way the second rotation arm 97 is locked relative to the first rotation arm 93 in the operational position, during rotation of the unit 65 from the operational position to the first intermediate position, and in the first intermediate position.

Figure 9B:
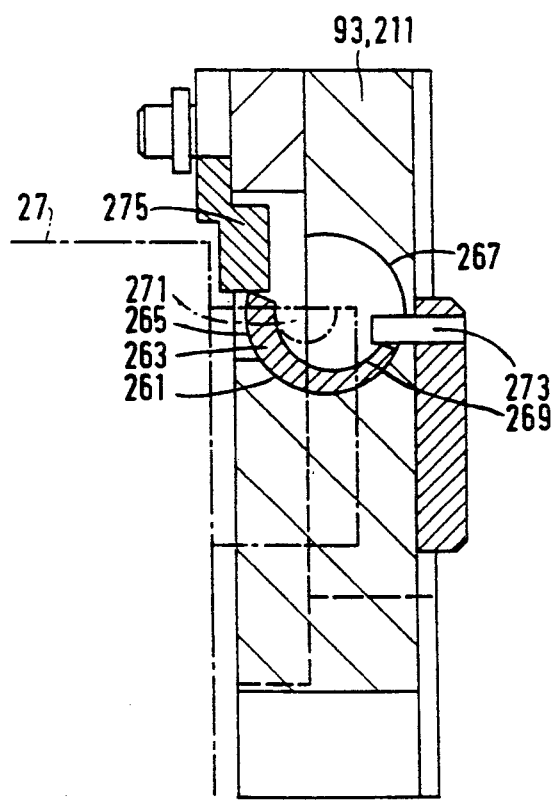
FIG. 9b shows a cross-section of the end of the rotation arm taken on the line IXb—IXb in FIG. 7.

As is shown in detail in FIGS. 7 and 9b, the end 211 of the first rotation arm 93 is provided with a locking bolt 259 which can rotate in a drilled hole 261 provided in the end 211. As FIG. 9b shows, the locking bolt 259 is provided with a C-shaped end 263 having a circular outer wall 265 which is guided along a circular inner wall 267 of the drilled hole 261, and having a circular inner wall 269 which is provided eccentrically relative to the outer wall 265. In the first intermediate position of the unit 65, the C-shaped end 263 of the locking bolt 259 is in engagement with a locking pawl 271 which is fastened to the base portion 27 of the frame 7 and which is shown diagrammatically in FIG. 9b. Rotation of the locking bolt 259 is prevented during this by a fixed locking pin 273 which is fastened to the end 211 of the first rotation arm 93 and by a locking block 275 which is fastened to the second end 245 of the slide arm 231 and which is in a position as shown in FIG. 7 in the first intermediate position of the unit 65. In this way the first rotation arm 93 is locked relative to the frame 7 in the operational position, during rotation of the unit 65 from the operational position to the first intermediate position, and in the first intermediate position.

Figure 9C:
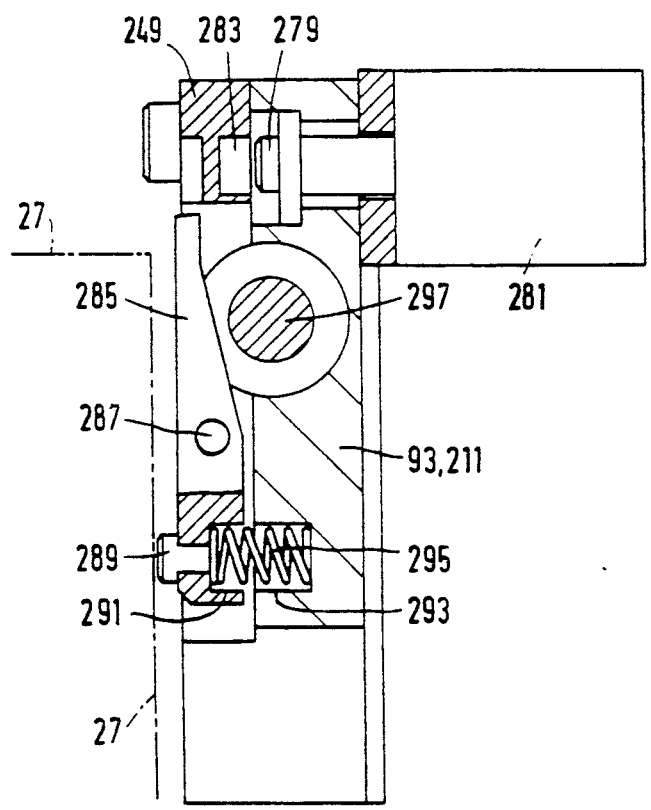
FIG. 9c shows a cross-section of the end of the rotation arm taken on the line IXc—IXc in FIG. 7.

To turn the unit 65 from the first intermediate position to the second intermediate position, the tilting lever 249 is rotated by hand about the bolt 253 against the spring pressure of the mechanical spring 257, so that the locking pawl 255 of the tilting lever 249 is released from the first recess 247 of the slide arm 231 and the second rotation arm 97 is unlocked relative to the first rotation arm 93. The second rotation arm 97 is then turned by hand about the second hinge pin 99, during which the lower side 75 of the support member 35 is guided over the support wheel 209. During rotation of the unit 65 from the first intermediate position to the second intermediate position, the static gas bearings 199 remain operational, so that a stable support is provided for the unit 65. When the second intermediate position is reached, the slide arm 231 is shifted so far that the locking pawl 255 of the tilting lever 249 is pulled into a second recess 277 of the slide arm 231 under the influence of the mechanical spring 257. Thus the second rotation arm 97 is locked relative to the first rotation arm 93 in the second intermediate position. In this second intermediate position, the static gas bearings 199 are switched off since the unit 65 is supported in a stable manner in this intermediate position by the support plate 207 of the second rotation arm 97 and by the support wheel 209 of the first rotation arm 93. When the static gas bearings 199 are switched off, a safety pawl 279 shown in FIGS. 7 and 9c is automatically slid into a recess 283 of the tilting lever 249 by means of a further pneumatic short-stroke cylinder 281 fastened to the end 211 of the first rotation arm 93. The use of the safety pawl 279 prevents the locking pawl 255 of the tilting lever 249 from being removed from the second recess 279 and prevents the unit 65 from being returned to the first intermediate position when the static gas bearings 199 are not operating.

Figure 3C:
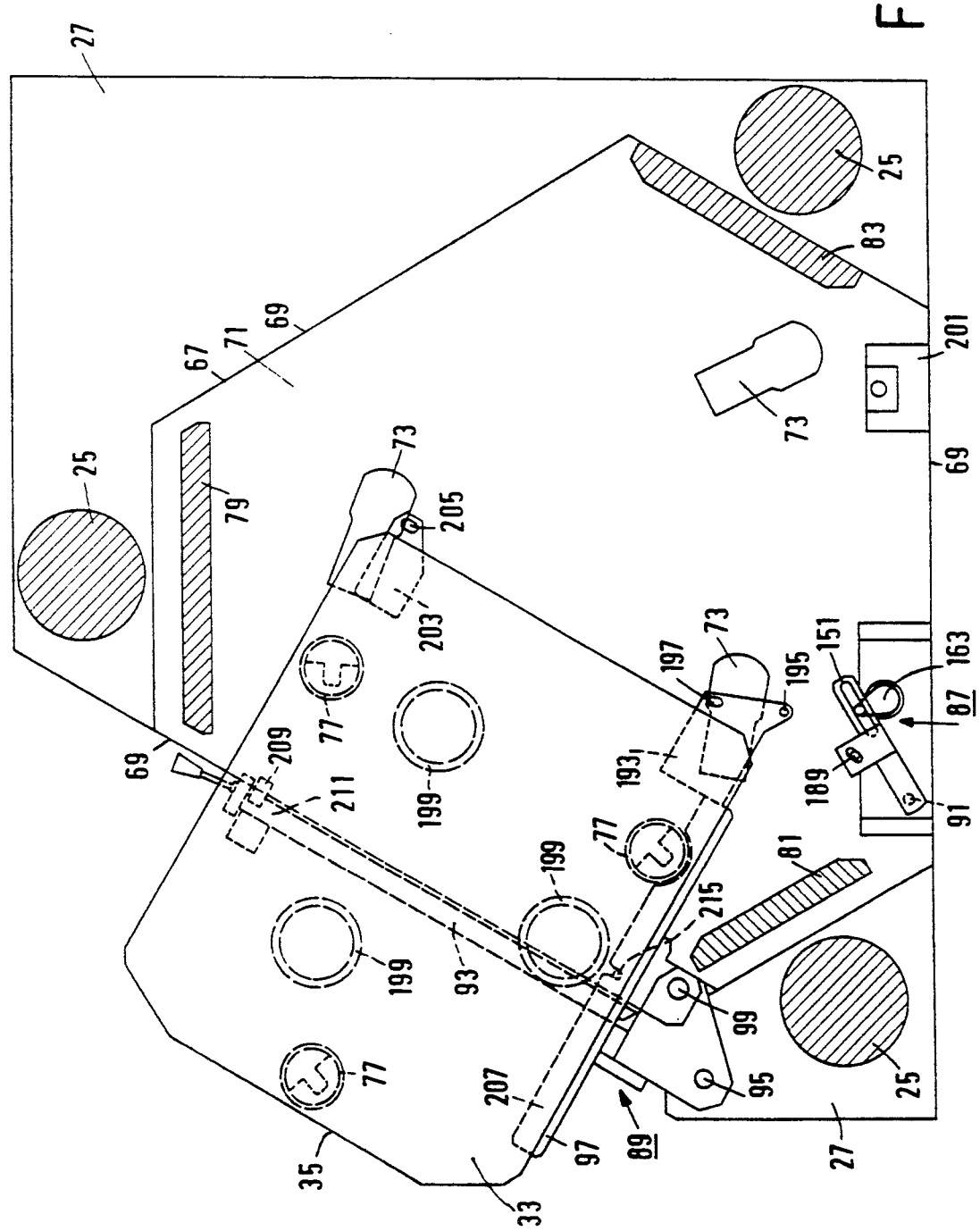

In the second intermediate position of the unit 65 shown in FIG. 3c, the slide arm 231 is shifted so far that the locking block 275 of the slide arm 231 shown in FIGS. 7 and 9b just clears the C-shaped end 263 of the locking bolt 259 and the locking bolt 259 is rotatable. When the locking bolt 259 is rotated through an angle of substantially 180° the locking pawl 271 fastened to the base portion 27 is released and the first rotation arm 93 is unlocked relative to the frame 7. The first rotation arm 93 is now rotatable by hand about the first hinge pin 95 from the second intermediate position to the end position shown in FIG. 3d.

As is shown in FIGS. 7 and 9c, a safety lever 285 is provided near the end 211 of the first rotation arm 93, which safety lever is rotatable about a rotation pin 287 and is provided with a stop 289. A further mechanical spring 295 is provided with pre-tension in a recess 291 of the safety lever 285 and a recess 293 of the end 211 of the first rotation arm 93. When the first rotation arm 93 is locked relative to the base portion 27 in the second intermediate position of the unit 65, the safety lever 285 is held in a position shown in FIG. 9c against the spring pressure of the mechanical spring 295 since the stop 289 of the safety lever 285 bears on the base portion 27. The tilting lever 249 is rotatable in this position of the safety lever 285. When the first rotation arm 93 has been turned away from the base portion 27, the safety lever 285 is turned to against the shaft portion 297 of the locking bolt 259, which portion has a reduced diameter compared with the drilled hole 261, under the influence of the mechanical spring 295. In this position of the safety lever 285, the tilting lever 249 when rotated is checked by the safety lever 285, so that the second rotation arm 97 cannot be unlocked relative to the first lever.

It is noted that, instead of the plate-shaped carrier 67, alternative carriers may be used, such as, for example, a frame carrier. It is also possible to use, instead of the carrier 67, a construction in which the support member 35 is provided with a number of fastening members by which the support member 35 is fastened to the suspension elements 79, 81, 83. The use of a plate-shaped carrier 67, however, provides a number of constructional advantages such as, for example, the use of the rotation mechanism 87 with the static gas bearings 199.

It is further noted that, instead of the plate-shaped suspension elements 79, 81, 83, alternative suspension elements, such as, for example, rod-shaped suspension elements, or a different number of suspension elements, may be used. The use of the three plate-shaped suspension elements 79, 81, 83, however, as described above, provides a particularly rigid and compact suspension of the carrier 67 from the lower side 85 of the mounting member 5. It is further noted that the carrier 67 may also be suspended from an upper side of the mounting member 5, for example, by means of a brace or a bracket construction. It is essential in this connection, however, that the carrier 67 with the unit 65 should be positioned between the lower frame supports 25, so that a particularly compact construction of the optical lithographic device in the z-direction is obtained.

It is further noted that the use of the rubber plates 63 between the positioning device 37 and the support member 35 and of the rubber plates 123 between the support member 35 and the carrier 67 achieves in a constructionally particularly simple manner that the positioning device 37 is screened from mechanical vibrations of the frame7. Instead of the rubber plates 63 and the rubber plates 123, alternative spring members or combinations of a spring member and a damping member may also be used, so that a greater bandwidth may be achieved. In general, however, this leads to a more intricate construction of the said unit 65.

It is further noted that, especially in the case of a compact construction of the frame 7 with lower frame supports 25 and suspension elements 79, 81, 83 arranged in a triangle, a displacement of the unit 65 to outside the frame 7 is rendered possible by the use of the rotation mechanism 87 in conjunction with the swivel mechanism 89, the unit 65 being rotatable by three consecutive rotation movements from the operational position to the end position. A displacement mechanism by means of which only the positioning device or a unit formed by the positioning device and the support member can be moved relative to the frame can be applied also in other lithographic devices, in which the frame has a less compact construction or more than three lower frame supports 25, or in which the support member forms a base part of the frame. It is also possible then to use a translation movement of the positioning device or of the unit instead of one or several rotation movements. When a translation movement is used, the displacement mechanism may be provided, for example, with one or several straight guide rails, the support member being fitted with roller members.

It is further noted that instead of the rotation mechanism 87 a rotation mechanism of simpler construction may be used, the unit 65 being manually turned from the operational position to the first intermediate position. The use of the rotation mechanism 87, however, whereby the unit 65 is rotated by means of a drive motor 163, and of the coupling mechanism 201 renders a more accurate positioning of the unit 65 in the operational position possible.

Finally, it is noted that the optical lithographic device described above is eminently suitable for illuminating semiconductor substrates in the manufacture of integrated electronic circuits. Such a lithographic device, however, is also applicable in the manufacture of other products having structures with detail dimensions in the micron or submicron range, where mask patterns have to be imaged on a substrate by means of the device. Possibilities here are structures of integrated optical systems, or conductor and detection patterns of magnetic domain memories, and structures of liquid crystal imaging patterns.

We claim:

1. A lithographic device comprising a lithograpic irradiation system which has a vertical main axis parallel to a z-direction and is fastened near a lower side to a mounting member belonging to a frame of the device, and comprising a positioning device which is arranged below the irradiation system and by means of which an object table is displaceable relative to the irradiation system over a guide surface of a support member coupled to the positioning device, which guide surface extends perpendicular to the z-direction, characterized in that the positioning device and the support member are positioned as a unit on a carrier which is suspended from the mounting member.

2. A lithographic device as claimed in claim 1, characterized in that the support member is coupled to the carrier by means of a first elastic coupling member and a first damping member, while the positioning device is fastened to the support member by means of a second elastic coupling member and a second damping member.

3. A lithographic device as claimed in claim 1 or 2, characterized in that the carrier of the support member and of the positioning device is suspended from the mounting member by means of plate-shaped suspension elements, each of the said suspension elements extending in a vertical plane which is parallel to the main axis.

4. A lithographic device as claimed in claim 3, characterized in that the carrier is suspended from the mounting member by means of three plate-shaped suspension elements, the mounting member being fastened on a base of the frame by means of three lower frame supports, while the suspension elements are arranged in a triangle and the said vertical planes enclose mutual angles of substantially 60°, each of the lower frame supports being positioned near an external side of one of the suspension elements seen in a radial direction relative to the main axis.

5. A lithographic device as claimed in any one of the preceding claims, characterized in that the unit formed by the support member and the positioning device is displaceable in a direction transverse to the main axis relative to the carrier and the mounting member.

6. A lithographic device as claimed in any one of the preceding claims, characterized in that the unit formed by the support member and the positioning device is rotatable relative to the carrier and the mounting member about an axis of rotation which is directed substantially parallel to the main axis.

7. A lithographic device as claimed in claim 6, characterized in that the unit is rotatable by a first rotation movement from an operational position, in which the support member is coupled to the carrier, to a first intermediate position, is rotatable by a second rotation movement from the first intermediate position to a second intermediate position, and is rotatable by a third rotation movement from the second intermediate position to an end position in which the unit is entirely outside the frame.

8. A lithographic device as claimed in claim 7, characterized in that during the first rotation movement of the unit the support member is coupled to a rotation shaft connected to the frame and is guided over an upper surface of the carrier by means of a static fluid bearing.

9. A lithographic device as claimed in claim 7 or 8, characterized in that in the first intermediate position of the unit the support member is couplable to a second rotation arm which is rotatably supported on a first rotation arm rotatably mounted to the frame, the second rotation arm being locked relative to the first rotation arm and the first rotation arm being locked relative to the frame during the first rotation movement of the unit, in that the second rotation movement of the unit is formed by a rotation movement of the second rotation arm relative to the first rotation arm, during which the support member is coupled to the second rotation and the first rotation arm is locked relative to the frame, in that the second rotation arm can be locked relative to the first rotation arm in the second intermediate position of the unit, and in that the third rotation movement of the unit is formed by a rotation movement of the first rotation arm relative to the frame, during which the support member is coupled to the second rotation arm and the second rotation arm is locked relative to the first rotation arm.

* * * * *